United States Patent
Adachi et al.

(10) Patent No.: US 10,459,027 B2
(45) Date of Patent: Oct. 29, 2019

(54) SEMICONDUCTOR TEST APPARATUS FOR TESTING SEMICONDUCTOR DEVICES

(71) Applicant: UNITECHNO, INC., Tokyo (JP)

(72) Inventors: Tomoaki Adachi, Tokyo (JP); Munehiro Yamada, Tokyo (JP)

(73) Assignee: UNITECHNO, INC., Tokyo (JP)

( * ) Notice: Subject to any disclaimer, the term of this patent is extended or adjusted under 35 U.S.C. 154(b) by 69 days.

(21) Appl. No.: 15/562,821

(22) PCT Filed: Mar. 31, 2015

(86) PCT No.: PCT/JP2015/060148
§ 371 (c)(1),
(2) Date: Sep. 28, 2017

(87) PCT Pub. No.: WO2016/157415
PCT Pub. Date: Oct. 6, 2016

(65) Prior Publication Data
US 2018/0106860 A1    Apr. 19, 2018

(51) Int. Cl.
*G01R 31/00* (2006.01)
*G01R 31/28* (2006.01)
(Continued)

(52) U.S. Cl.
CPC ....... *G01R 31/2893* (2013.01); *G01R 1/0466* (2013.01); *G01R 1/0735* (2013.01); *G01R 31/26* (2013.01)

(58) Field of Classification Search
CPC ............... G01R 31/26; G01R 31/2893; G01R 31/2851; G01R 1/0433; G01R 1/0466; G01R 1/0735
See application file for complete search history.

(56) References Cited

U.S. PATENT DOCUMENTS

| | | | |
|---|---|---|---|
| 4,987,365 A | 1/1991 | Shreeve et al. | |
| 6,456,062 B2 * | 9/2002 | Yamashita | G01R 31/01 324/757.01 |
| 2007/0216437 A1 * | 9/2007 | Slaughter | G01R 31/2893 324/750.09 |

FOREIGN PATENT DOCUMENTS

| | | |
|---|---|---|
| JP | H02305448 A | 12/1990 |
| JP | H0647881 B2 | 6/1994 |

(Continued)

OTHER PUBLICATIONS

International Search Report in International Application No. PCT/JP2015/060148, dated Jun. 23, 2015.

*Primary Examiner* — Minh N Tang
(74) *Attorney, Agent, or Firm* — Venable LLP; Henry J. Daley; Laura G. Remus

(57) ABSTRACT

A semiconductor test apparatus capable of securely having the contact pin and the external contact terminal held in contact with each other even in case where the vertical type handler is used. The semiconductor test apparatus comprises: a test socket having a socket surface formed thereon, the socket surface having a contact pin towering therefrom; and a semiconductor transport fixture having a concave portion formed thereon, the concave portion adapted to receive therein an IC under test, wherein the test socket has a position adjustment guide provided thereon, the semiconductor transport fixture has a guide through bore formed therein, the guide through bore adapted to receive the position adjustment guide therethrough when the IC under test comes under test, and either one of the position adjustment guide or the guide through bore is formed in a tapered shape.

6 Claims, 20 Drawing Sheets

(51) Int. Cl.
  *G01R 31/26* (2014.01)
  *G01R 1/073* (2006.01)
  *G01R 1/04* (2006.01)

(56) References Cited

FOREIGN PATENT DOCUMENTS

| JP | H0647881 U | 6/1994 |
| JP | 2008-261861 A | 10/2008 |
| JP | 2009-524074 A | 6/2009 |
| JP | 2012163550 A * | 8/2012 |

* cited by examiner

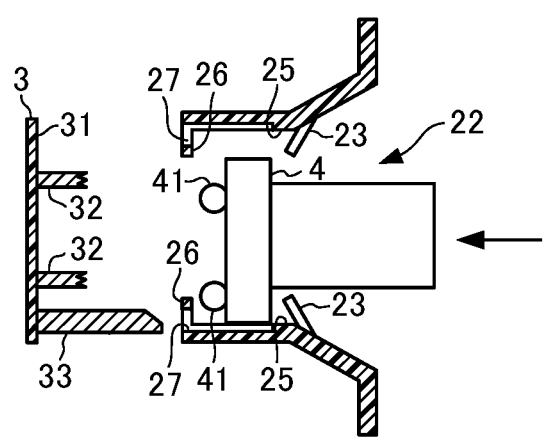

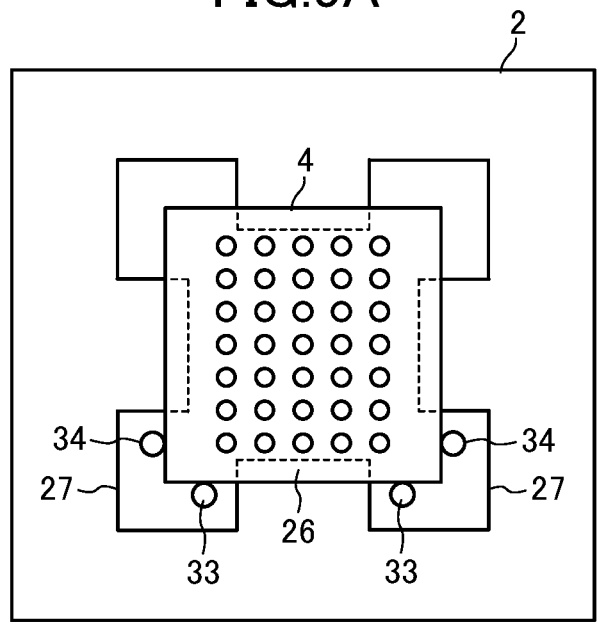

SEMICONDUCTOR TEST APPARATUS FOR TESTING SEMICONDUCTOR DEVICES

This application is a U.S. National Stage Application under 35 U.S.C. § 371 of PCT/JP2015/060148, filed on Mar. 31, 2015, the entire content of which is hereby incorporated by reference.

TECHNICAL FIELD

The present invention relates to a semiconductor test apparatus to test semiconductor devices, particularly to a semiconductor test apparatus to be utilized for semiconductor test using vertical type handlers.

In recent years, semiconductor devices have been widely used in all the industry fields, so that the semiconductor devices are currently manufactured under mass production, thereby arising needs for further efficiency in the pre-shipment test of the semiconductor devices. The test of the semiconductor devices is usually carried out by a device called a handler. In the test by handlers, such a testing method is generally employed that a large number of semiconductors arranged on a transport frame are collectively tested.

However, while increasing number of handlers are manufactured associated with the mass production of the semiconductor devices, the number of the handlers that can be installed in the semiconductor test site having a limited space is reaching a limitation, thereby arising an issue that the efficiency of semiconductor test cannot be improved.

In an attempt to solve this issue, practical application of vertical type handlers, replacing conventional horizontal type handlers wherein the transport frame is horizontally placed in testing semiconductor devices, is advancing, thereby making it possible to reduce a space per one handler installed in the test facilities (For example, see Patent Literature 1 and Patent Literature 2).

In semiconductor testing using vertical type handlers, the transport frame, having a number of semiconductors (hereinafter referred to as "IC under test") mounted thereon, is vertically held during the test of the IC under test, so that the vertical type handlers require less space for installation than in case of the horizontal type handlers.

BACKGROUND ART

Patent Literature

Patent Literature 1: Japanese Patent Publication No. 2008-261861
Patent Literature 2: Japanese Patent Publication No. 2009-524074

SUMMARY OF INVENTION

Technical Problem

However, when the transport frame is held vertically, the semiconductor transport fixtures, each containing IC under test therein, mounted on the transport frame are held vertically at the same time, resulting in fact that the ICs under test drop downward a gap space in the semiconductor transport fixtures due to its own weight, thereby causing a displacement of the ICs under test.

Meanwhile, if the size of the space (concave portion) in the semiconductor transport fixture (insert) for receiving therein the IC under test has the same size as the size of the IC under test, then mounting and dismounting of the IC under test would be extremely difficult, so that it takes tremendous amount of effort and time to mount and dismount the IC under test, thereby deteriorating the efficiency of the semiconductor test. Therefore, the size of the concave portion of the semiconductor transport fixture must inevitably be slightly larger than the size of the IC under test. For this reason, it is generally the case that there exists a gap space in the concave portion of the semiconductor transport fixture when the IC under test is received therein.

As mentioned above, it is inevitable to allow some gap space between the semiconductor transport fixture (hereinafter also referred to as "an insert") and the IC under test. However, this means that, as explained above, there arises the displacement of the IC under test as a result of dropping downward the gap space due to its own weight in case of the vertical type handler, wherein the transport frame is held vertically. Consequently, there arises such a problem that in case of the vertical type handler, an external contact terminal of the IC under test received in the semiconductor transport fixture mounted on the transport frame does not come in contact with a contact pin of a test socket placed in a face-to-face relationship with the IC under test during the test of the IC under test.

Further, during the test of the IC under test, the IC under test is pushed toward the test socket by a member called a pusher, because it is necessary to have the contact pin and the external contact terminal held in contact with each other. At this time, if the IC under test is pushed toward the test socket in a state where the IC under test is kept in contact with a lower end of the concave portion of the insert, then the external contact terminal of the IC under test would hit an edge extending inward from an end of the insert and the IC under test is further pushed by the pusher, thereby damaging the external contact terminal.

It is therefore an object of the present invention to provide a semiconductor test apparatus capable of securely having the contact pin of the test socket and the external contact terminal of the IC under test held in contact with each other even in case where the vertical type handler is used in the test of the IC under test.

Solution to Problem

The semiconductor test apparatus according to the present invention is a semiconductor test apparatus, comprising: a test socket having a socket surface formed thereon, the socket surface having a contact pin towering therefrom; and a semiconductor transport fixture having a concave portion formed thereon, the concave portion adapted to receive therein an IC under test, wherein the test socket has a position adjustment guide provided thereon, the semiconductor transport fixture has a guide through bore formed therein, the guide through bore adapted to receive the position adjustment guide therethrough when the IC under test comes under test, and either one of the position adjustment guide or the guide through bore is formed in a tapered shape.

By the construction as described above (1), the semiconductor test apparatus according to the present invention is so constructed that even in case the IC under test is displaced downward by its own weight when the transport frame is held vertically, the IC under test is pushed upward by the taper shape of either one of the position adjustment guide or the guide through bore as the position adjustment guide penetrates into the guide through bore when the IC under test is pushed toward the test socket in the test of the IC under test, thereby resolving the downward displacement of the IC under test, so that the contact pin of the test socket and the external contact terminal of the IC under test are securely held in contact with each other. Further, as the IC under test is pushed upward, the external contact terminal of the IC under test can be prevented from being pushed in the state of being kept in contact with the edge of the semiconductor transport fixture, thereby preventing the external contact terminal from being damaged.

The semiconductor test apparatus according to the present invention (2), constructed as described in above (1), is so constructed that the position adjustment guide is fixed to perpendicularly tower from the socket surface, and the position adjustment guide is formed in a tapered shape approaching the contact pin as advancing in a longitudinal direction from a tip toward a base thereof.

By the construction as described above (2), the semiconductor test apparatus according to the present invention is so constructed that, in the test of the IC under test, the IC under test is pushed toward the test socket, so that the IC under test moves along the tapered portion of the position adjustment guide, thereby causing the IC under test to be pushed upward. Since the position adjustment guide has previously been adjusted its position with the position of the contact pin, the downward displacement is solved as the IC under test is pushed upward, thereby securely ensuring the contact between the contact pin of the test socket and the external contact terminal of the IC under test.

The semiconductor test apparatus according to the present invention (3), constructed as described in above (1), is so constructed that the position adjustment guide is rotatably supported by a hinge mechanism arranged on the test socket, the position adjustment guide is so urged to perpendicularly tower from the socket surface, and the guide through bore is formed in a tapered shape approaching the concave portion as advancing toward inside thereof.

By the construction as described above (3), the semiconductor test apparatus according to the present invention is so constructed that, in the test of the IC under test, the IC under test is pushed toward the test socket, so that the position adjustment guide penetrates into the guide through bore, thereby causing the position adjustment guide is pushed upward by the tapered shape of the guide through bore, with the result that the IC under test, which is supported from beneath by the position adjustment guide, is pushed upward. Thus, the downward displacement is solved as the IC under test is pushed upward, thereby securely ensuring the contact between the contact pin of the test socket and the external contact terminal of the IC under test.

The semiconductor test apparatus according to the present invention (4), constructed as described in above (3), is so constructed that the position adjustment guide has a small protrusion provided on an upper side thereof.

By the construction as described above (4), the semiconductor test apparatus according to the present invention is so constructed that since the IC under test is positioned from the opposite side of the test socket, it is possible, in the test of the IC under test, to prevent the IC under test from being displaced in the direction that the IC under test is spaced apart again from the socket under test.

The semiconductor test apparatus according to the present invention (5), constructed as described in above (1), is so constructed that the test socket has a lateral position adjustment guide further provided respectively in a right end portion and a left end portion on the socket surface, each of the lateral position adjustment guides towering perpendicularly from the socket surface, the guide through bore is adapted to receive the lateral position adjustment guide therethrough when the IC under test comes under test, and either one of the lateral position adjustment guide or the guide through bore is formed in a tapered shape.

By the construction as described above (5), the semiconductor test apparatus according to the present invention is so constructed that not only the downward displacement but also the right-left (horizontal) displacement can be solved, thereby securely ensuring the contact between the contact pin of the test socket and the external contact terminal of the IC under test.

The semiconductor test apparatus according to the present invention (6), constructed as described in above (1), is so constructed that the test socket has the position adjustment guide provided thereon, the test socket including a plurality of the contact pins and a positioning base, the positioning base being located among the neighboring plurality of contact pins, the positioning base being urged to be at a position more spaced apart from the socket surface than a tip of the contact pin.

By the construction as described above (6), the semiconductor test apparatus according to the present invention is so constructed that the position adjustment guide is capable of securely guiding the IC under test on the positioning base.

Advantageous Effect of Invention

The present invention can provide a semiconductor test apparatus capable of securely having the contact pin of the test socket and the external contact terminal of the IC under test held in contact with each other even in case where the vertical type handler is used in the test of the IC under test.

BRIEF DESCRIPTION OF THE DRAWINGS

FIGS. 4A, 4B, 4C and 4D are schematic diagrams showing a semiconductor test apparatus according to the first embodiment of the present invention.

FIGS. 5A and 5B are schematic diagrams respectively showing a state of a semiconductor testing by a semiconductor test apparatus according to the first embodiment of the present invention.

DESCRIPTION OF EMBODIMENTS

Hereinafter, embodiments of the present invention will be explained with reference to drawings.

First Embodiment

First, the construction will be explained.

A semiconductor test apparatus 1 according to the present invention comprises an insert 2 and a test socket 3. First, the construction of the insert 2 will be explained.

Figure 1:
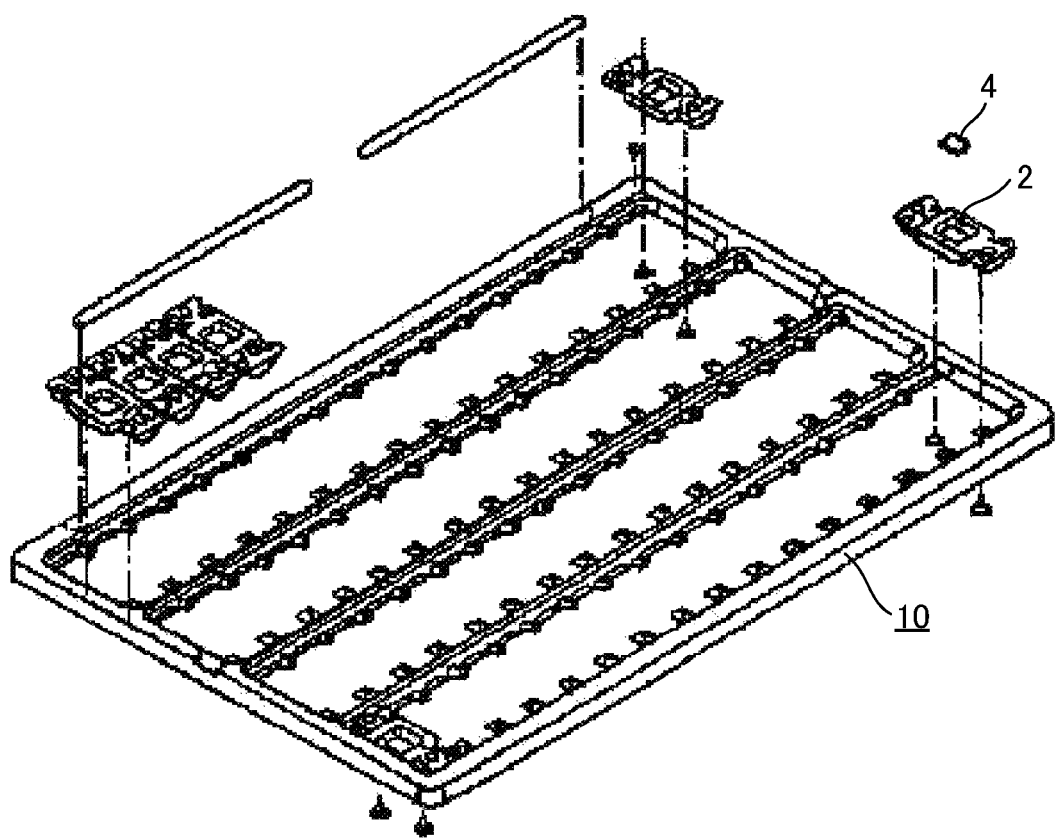
FIG. 1 is a perspective view showing a semiconductor transport fixture according to one embodiment of the present invention mounted on the transport frame.

FIG. 1 is a perspective view showing the insert 2 according to one embodiment of the present invention mounted on the transport frame 10. The metal transport frame 10 has a plurality of mounting sections, each of which is screwed with the insert 2 adapted to have an integrated circuit (IC) 4 inserted therein. The transport frame 10, for example, has 8×8 mounting sections. The transport frame 10, having a plurality of inserts 2 mounted thereon from above, is transported in a horizontal (flat) state. The insert 2 constitutes a semiconductor transport fixture according to the present invention, while the IC 4 constitutes an IC under test according to the present invention.

Figure 2A:
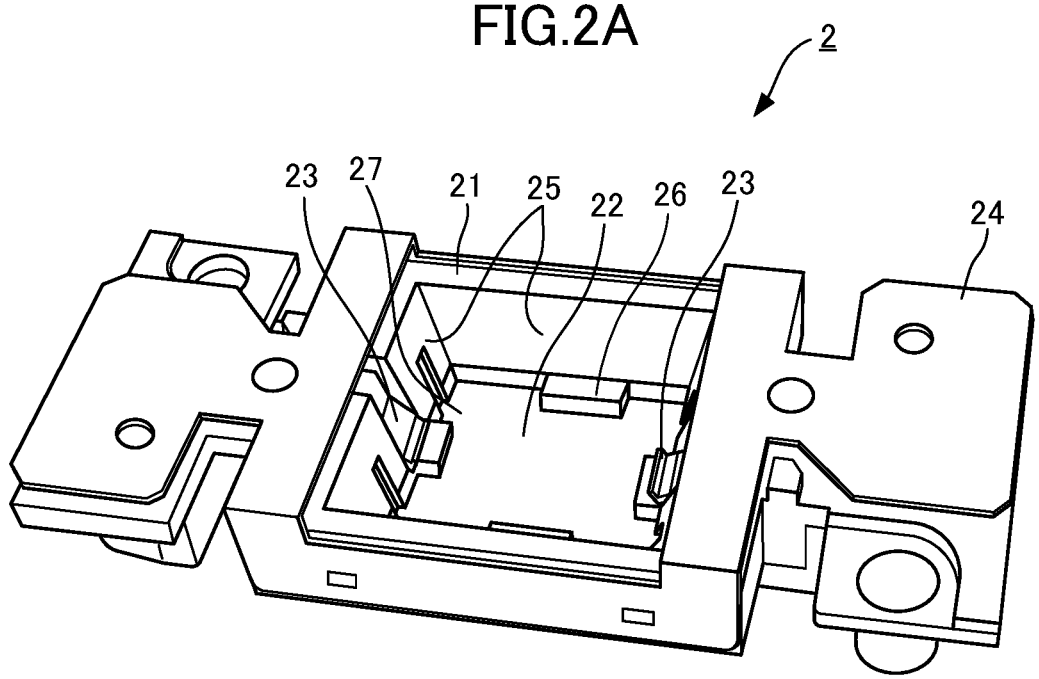
FIG. 2A is an upper perspective view showing the semiconductor transport fixture according to one embodiment of the present invention.
Figure 2B:
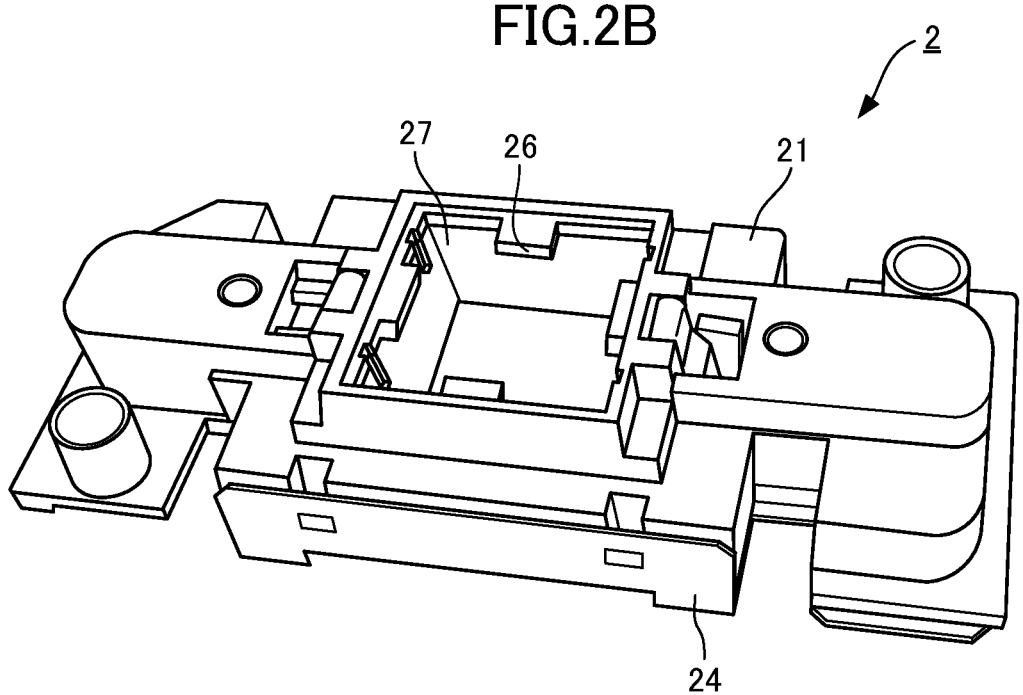
FIG. 2B is a lower perspective view showing the semiconductor transport fixture according to one embodiment of the present invention.

FIG. 2A is an upper perspective view showing the insert 2 according to one embodiment of the present invention, while FIG. 2B is a lower perspective view showing the insert 2 according to one embodiment of the present invention. A resin main body 21 of the insert 2 has formed therein a concave portion 22, serving as a space to receive the IC 4.

The concave portion 22 is defined by four side walls 25. From the bottom line of each of the four side walls 25 is extending an edge 26 toward inside of the concave portion 22. The edge 26 supports from beneath the IC 4, received in the concave portion 22.

A guide through bore 27 is formed at each of the four corners of the bottom of the concave portion 22. In the test of the IC 4, the guide through bore 27 receives therethrough a position adjustment guide 33 (to be explained later) and a lateral position adjustment guide 34 (to be explained later) provided on a test socket 3 (to be explained later).

At least one of the side walls 25 of the concave portion 22 has a latch 23 formed thereon. The latch 23 is adapted to protrude from the side wall 25 over the IC 4 when the IC 4 is inserted into the concave portion 22. The latch 23 is so constructed to be pulled into the side wall 25 of the concave portion 22 by pressing down an operation plate 24 covering an upper surface of the main body 21 of the insert 2, thereby allowing the IC 4 to be inserted into the concave portion 22.

When to insert the IC 4 into the insert 2 (semiconductor transport fixture), the operation plate 24 is pressed down, so that the latch 23 is pulled into the side wall 25 of the concave portion 22. Thereafter, the IC 4 is inserted into the concave portion 22 in such a manner that a solder ball 41 of the IC 4 faces down. Then, upon the completion of the IC 4 insertion, the operation plate 24 is released to let the latch 23 protrude again from the side wall 25 over the inserted IC 4, thereby to prevent the IC 4 from dropping out of the insert 2 during the transportation. The solder ball 41 constitutes an external contact terminal.

The concave portion 22 is so designed that, when the IC 4 is inserted therein, there appears a gap between the IC 4 and the side wall 25 of the concave portion 22. However, should the size of the concave portion 22 be exactly the same as the size of the IC 4, mounting and dismounting of the IC 4 would be difficult, causing troubles in the test of the IC 4. Therefore, it is necessary to adopt such a design in the portion 22 to allow a gap as it is necessary to avoid the aforementioned troubles in the test of the IC 4.

Next, the construction of a test socket 3 will be explained with reference to FIGS. 3A and 3B.

Figure 3A:
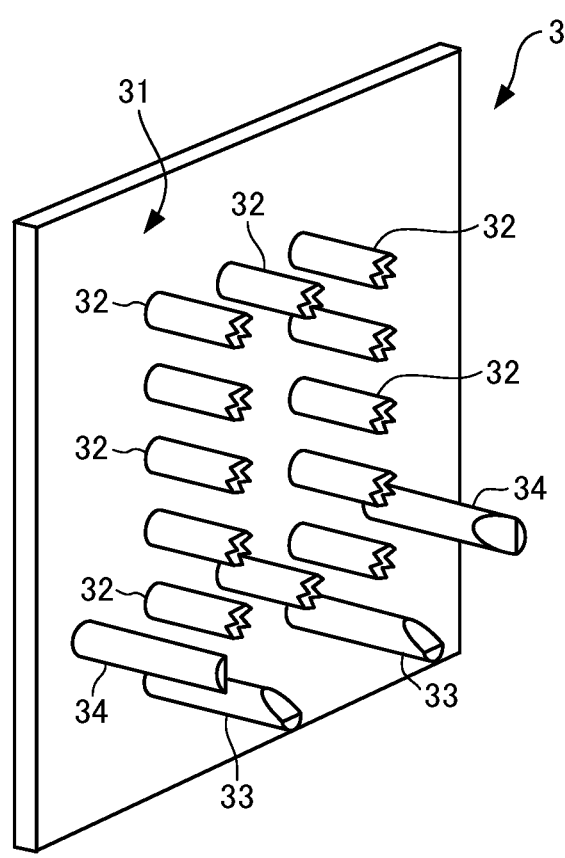
FIGS. 3A and 3B are a perspective views showing a test socket according to one embodiment of the present invention.
Figure 3B:
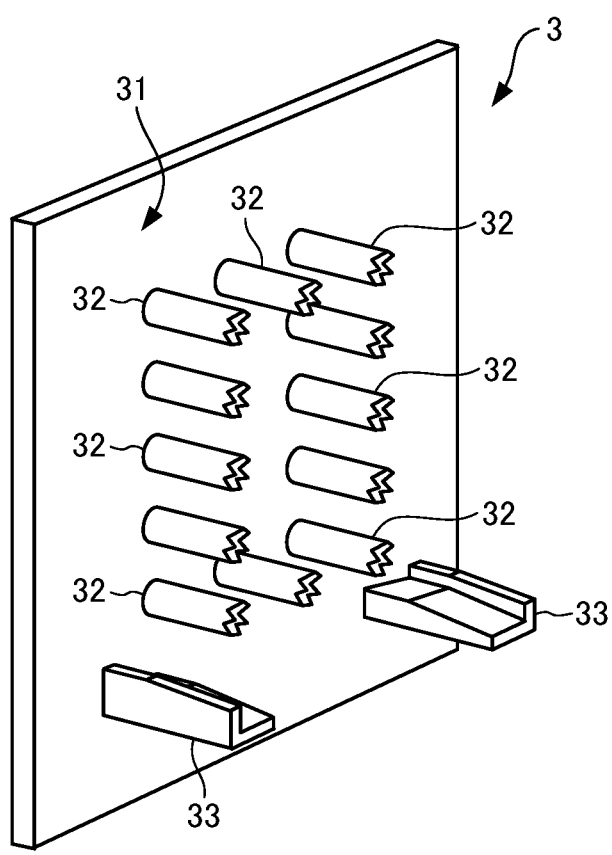

As shown in FIG. 3A, the test socket 3 has a socket surface 31 formed thereon, and a contact pin 32, a position adjustment guide 33, and a lateral position adjustment guide 34 are perpendicularly towering from the socket surface 31.

The contact pin 32, electrically connected with a test circuit (not shown), is adapted to come in contact with the solder ball 41 during the test of the IC 4, thereby to have the test circuit and the IC 4 electrically connected with each other.

The position adjustment guide 33 is fixed to tower from the socket surface 31. And, the position adjustment guide 33 has a tapered portion which is formed in a tapered shape approaching the contact pin 32 as advancing in a longitudinal direction from a tip toward a base of the position adjustment guide 33. The position adjustment guide 33 is provided at a position lower than the contact pin 32 when the socket surface 31 is held vertically during the test of the IC 4.

The lateral position adjustment guide 34 is fixed to tower from the socket surface 31. And, the lateral position adjustment guide 34 has a tapered portion which is formed in a tapered shape approaching the contact pin 32 as advancing in a longitudinal direction from a tip toward a base of the lateral position adjustment guide 34. The lateral position adjustment guide 34 is provided at a position which is right or left of the contact pin 32 when the socket surface 31 is held vertically during the test of the IC 4.

The position adjustment guide 33 is shown as a round rod in FIG. 3A. However, the position adjustment guide 33 may otherwise be a square rod as shown in FIG. 3B, or some other shape.

FIGS. 4A, 4B, 4C and 4D are schematic diagrams showing a semiconductor test apparatus according to the first embodiment of the present invention. FIGS. 4A, 4B, 4C and 4D show a state where the IC 4 is being tested using a vertical type handler and the transfer frame 10 is held vertically.

Figure 4A:
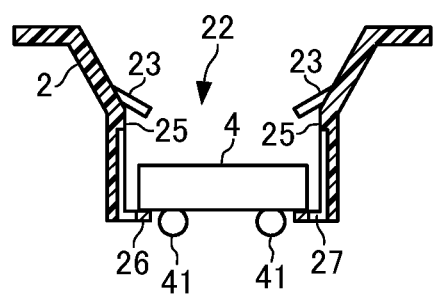

As shown in FIG. 4A, the IC 4 is inserted from above into the concave portion 22 of the insert 2, and the IC 4 is suppressed by the latch 23 so that the IC 4 would not drop out during the transportation. The inserts 2, each having the IC 4 received therein, are transported on the transport frame 10, having the inserts 2 mounted thereon.

Figure 4B:
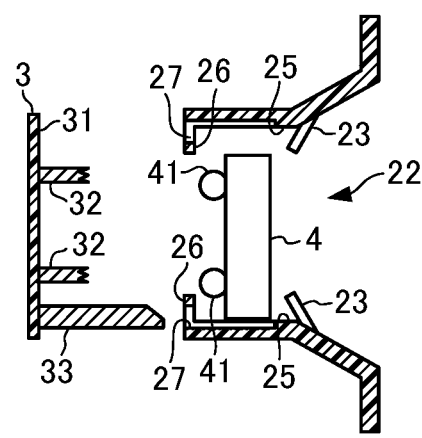

As shown in FIG. 4B, when the IC 4 comes under test, the transport frame 10 is held vertically, so that at the same time the insert 2 mounted on the transport frame 10 are held vertically as well. Since the test of the IC 4 is carried out in the state that the contact pin 32 connected to the test circuit and the solder ball 41 of the IC 4 are held in contact with each other, the test socket 3 is positioned to be in a face-to-face relationship with the insert 2 having the IC 4 received therein. At this time, the position adjustment guide 33 of the test socket 33 is positioned to be in a face-to-face relationship with the guide through bore 27 provided in the insert 2.

Figure 4D:
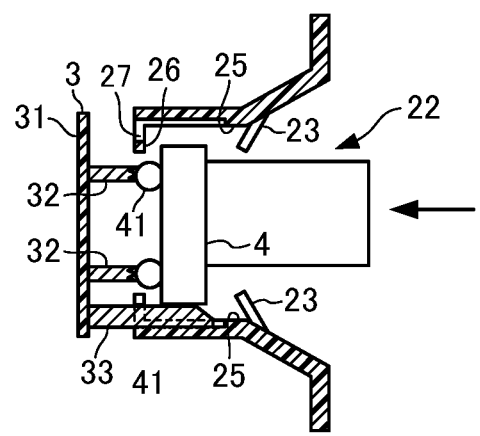

As shown in FIG. 4C, the IC 4 is pushed toward the test socket 3 by the pusher of the vertical type handler, with the result that, as shown in FIG. 4D, the solder ball 41 of the IC 4 is finally held in contact with the contact pin 32 of the test socket 3.

Here, the test socket 3 may be so constructed to be further provided with the lateral position adjustment guide 34, perpendicularly towering from the socket surface 31, respectively on the right end portion and the left end portion of the socket surface 31.

Figure 5B:
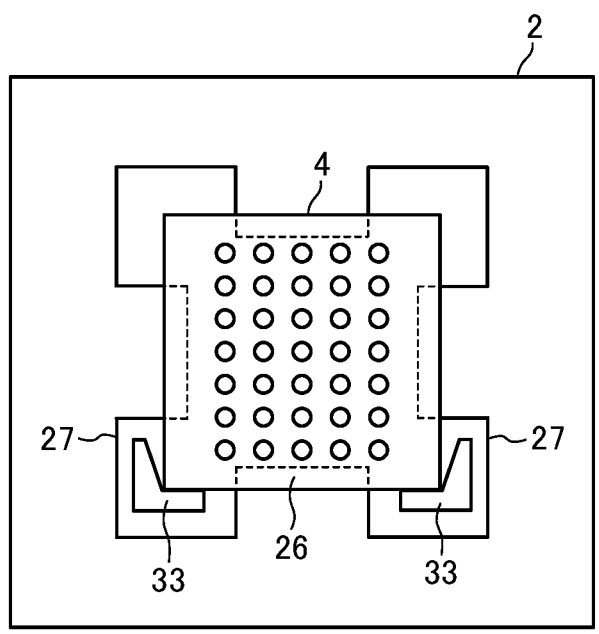

FIGS. 5A and 5B are schematic diagrams respectively showing a state of the IC 4 under test by a semiconductor test apparatus, wherein the IC 4 is guided its position by the position adjustment guide 33 and the lateral position adjustment guide 34. As shown in FIGS. 5A and 5B, the position adjustment guide 33 towering from the test socket 3 goes through the guide through bore 27 provided in the insert 2, moves into the concave portion 22, and then slips into the bottom of the IC 4 under test, thereby to push upward the IC 4 under test. And in a similar way, the lateral position adjustment guide 34 slips into the side of the IC 4 under test, thereby to guide the IC 4 under test toward the center.

FIG. 5A shows a case wherein the position adjustment guide 33 is constituted by a round rod, while FIG. 5B shows a case wherein the position adjustment guide 33 is constituted by a square rod. The present embodiment describes the cases wherein the position adjustment guide 33 is respectively constituted by a round rod or a square rod. However, the position adjustment guide 33 may otherwise be in other shape.

Next, the operation will be explained.

As shown in FIG. 4A, when the IC 4 is inserted into the concave portion 22, there appears a gap between the IC 4 and the side wall 25 of the concave portion 22. For this reason, as shown in FIG. 4B, when a vertical type hander is used, the transport frame 10 having inserts 2 mounted thereon is held vertically at the test of the IC 4, so that, at the same time, the inserts 2 mounted on the transport frame 10 fall down sideways, thereby causing the IC 4 received in the insert 2 to drop down on the side wall 25 of the concave portion 22 due to its own weight, resulting in the downward displacement of the IC 4.

Subsequently, as shown in FIG. 4C, when the IC 4 comes under test, the IC 4 is pushed toward the test socket 3 by the pusher of the handler in a state where the insert 2 is laid sideways. At this time, the position adjustment guide 33 of the test socket 3 goes into and penetrates through the guide through bore 27 formed in the insert 2. The position adjustment guide 33, having gone through the guide through bore 27, appears on the surface of the side wall 25 of the concave portion 22, so that the position adjustment guide 33 comes in contact with the IC 4 which has been dropped down on the side wall 25. Subsequently, the IC 4 is further pushed toward the test socket 3 by the pusher.

The position adjustment guide 33 has a tapered portion which is formed in a tapered shape approaching the contact pin 32 as advancing in a longitudinal direction from a tip toward a base of the position adjustment guide 33. Therefore, the IC 4 held in contact with the position adjustment guide 33 moves along the tapered shape of the position adjustment guide 33, so that the IC 4 is pushed upward to be brought closer to the contact pin 32.

As a result, as shown in FIG. 4D, the downward displacement of the IC 4 is solved, thereby making it possible to securely have the contact pin 32 of the test socket 3 and the solder ball 41 of the IC 4 held in contact with each other.

As described in the foregoing, the semiconductor test apparatus 1 according the present embodiment is capable of securely having the contact pin 32 of the test socket 3 and the solder ball 41 of the IC 4 held in contact with each other even in case where the vertical type handler is used in the test of the IC 4.

Here, by further having the lateral position adjustment guide 34 provided, not only the downward displacement but also the right-left (horizontal) displacement can be solved at the same time, thereby making it possible to even more securely have the contact pin 32 of the test socket 3 and the solder ball 41 of the IC 4 held in contact with each other.

Second Embodiment

Figure 6A:
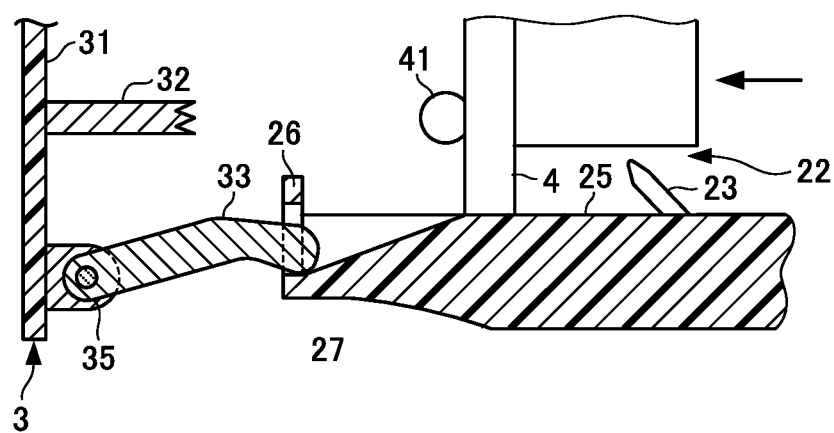
FIGS. 6A, 6B and 6C are schematic diagrams showing a semiconductor test apparatus according to the second embodiment of the present invention.

First, the construction of the present embodiment will be explained. The explanation of a part of the present embodiment that is the same as that of the first embodiment is omitted. As shown in FIG. 6A, the position adjustment guide 33 is rotatably supported by a hinge mechanism 35 arranged on the test socket 3, and the position adjustment guide 33 is so urged to perpendicularly tower from the socket surface 31 of the test socket 3.

On the other hand, the guide through bore 27 of the insert 2 has a tapered portion formed in a tapered shape approaching the concave portion 22 as advancing toward inside thereof.

Figure 6B:
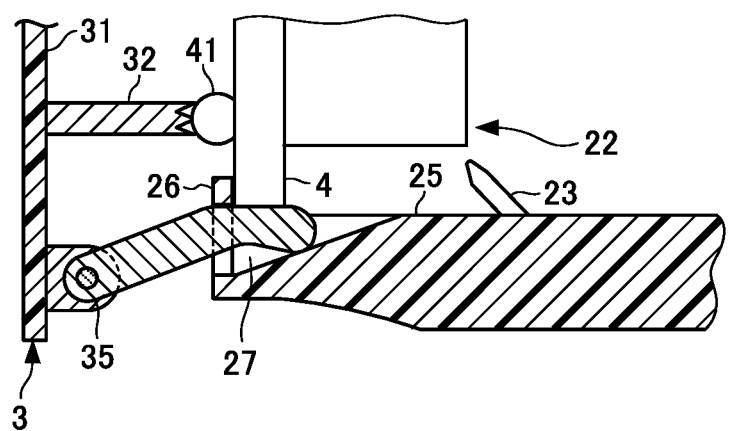
Figure 6C:
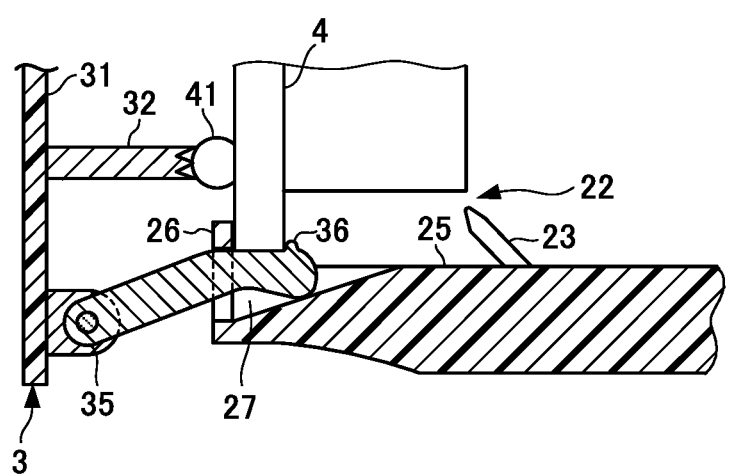

In addition, the position adjustment guide 33 may have a small protrusion 36 provided on an upper side thereof, as shown in FIG. 6C.

Next, the operation of the present embodiment will be explained. When the IC 4 is brought under test, the IC 4, pushed by the pusher of the handler, moves toward the test socket 3, so that, at the same time, the insert 2 moves toward the test socket 3 as well. As the result, the position adjustment guide 33 of the test socket 3 goes into and penetrates through the guide through bore 27 formed in the insert 2. The position adjustment guide 33, having gone through the guide through bore 27, appears on the surface of the side wall 25 of the concave portion 22, so that the position adjustment guide 33 comes in contact with the IC 4 which has been dropped down on the side wall 25. Subsequently, the IC 4 is further pushed toward the test socket 3 by the pusher.

At this time, since the guide through bore 27 of the insert 2 has a tapered portion formed in a tapered shape approaching the concave portion 22 as advancing toward inside thereof, the position adjustment guide 33 is pushed upward along the taper shape. As a result, the IC 4 sitting over the position adjustment guide 33 is pushed upward as well, so that the solder ball 41 is securely positioned to be in a face-to-face relationship with the contact pin 32.

As a result, as shown in FIG. 6B, the downward displacement of the IC 4 is solved, thereby making it possible to securely have the contact pin 32 of the test socket 3 and the solder ball 41 of the IC 4 held in contact with each other.

Here, as shown in FIG. 6C, in case the small protrusion 36 is provided on the upper side of the position adjustment guide 33, since the IC 4 is positioned from the opposite side of the test socket 3, it is possible to prevent the IC 4 from spacing apart again from the test socket 3 during the test of the IC 4.

Third Embodiment

Figure 7A:
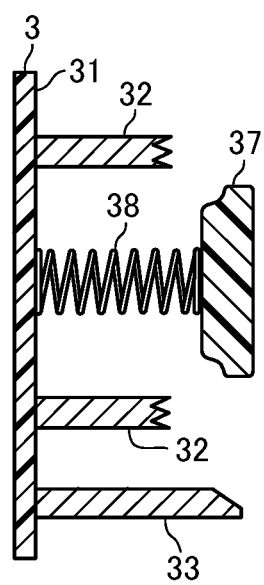
FIGS. 7A and 7B are schematic diagrams showing a semiconductor test apparatus according to the third embodiment of the present invention.

First, the construction of the present embodiment will be explained. The explanation of a part of the present embodiment that is the same as that of the first embodiment is omitted. As shown in FIG. 7A, the test socket 3 includes a plurality of contact pins 32 in a manner to avoid a central portion of the socket surface 31, and the test socket 3 has a positioning base 37 surrounded by the plurality of contact pins 32. And, the positioning base 37 is urged to be at a position more spaced apart from the socket surface 31 than a tip of the contact pins 32.

To be more specific, the positioning base 37 is supported by a coil spring 38, and when the positioning base 37 is acted by no external force except for the coil spring 38, a tip of the positioning base 37 is adapted to be positioned more spaced apart from the test socket 3 than the tip of the contact pins 32.

Figure 7B:
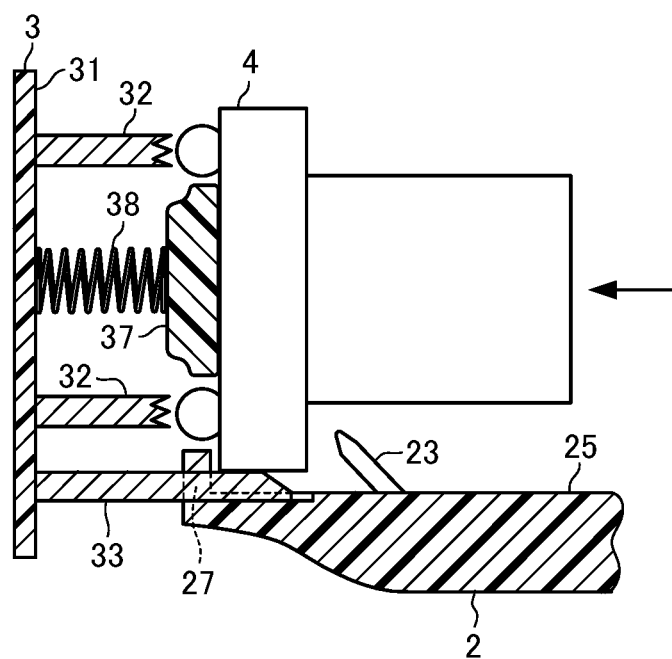

Next, the operation of the present embodiment will be explained. As shown in FIG. 7B, during the test of the IC 4, the IC 4 is pushed toward the test socket 3. Here, since the tip of the positioning base 37 is urged by the coil spring 38 to be at a position more spaced apart from the socket surface 31 than a tip of the contact pins 32, the IC 4 comes into contact with the positioning base 37 prior to the solder ball 41 comes in contact with the contact pin 32. The moment the IC 4 is brought into contact with the positioning base 37, the positioning base 37 is pushed back toward the test socket 3 against the urging force of the coil spring 38.

At this time, thanks to the position adjustment guide 33 being formed in the tapered shape, the IC 4 is lifted up by the tapered shape, with the result that IC 4 under test is seated on the positioning base 37 in a favorably positioned state. When the IC 4 is seated in a correct position, the positioning base 37 fits into between the solder balls 41, so that the IC 4 has its position fixed, allowing the IC 4, together with the insert 2, to be straightly pushed by the pusher in that state, thereby making it possible to have the solder balls 41 correctly held in a face-to-face relationship with a plurality of the contact pins 32, when the IC 4 is brought closer to the contact pin 32. The test socket 3 having such a positioning base 37 arranged thereon is particularly useful in case where the IC 4 is a narrow-pitch IC that requires a high precision of contact positioning.

Fourth Embodiment

Hereinafter, the fourth embodiment of the present invention will be explained with reference to FIG. 8. The present embodiment is an embodiment of a case in which the solder ball 41 is provided in a central portion of the IC 4 as well. The explanation of a part of the present embodiment that is the same as that of the first embodiment is omitted.

Figure 8A:
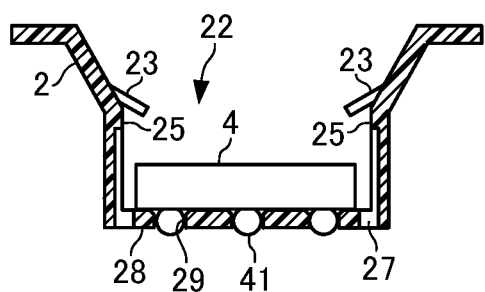
FIGS. 8A, 8B and 8C are schematic diagrams showing a semiconductor test apparatus according to the fourth embodiment of the present invention.

As shown in FIG. 8A, the insert 2 has a base plate 28 provided in the bottom thereof, in place of the edge 26. The base plate 28 has provided thereon a plurality of positioning bores 29 into which the solder balls 41 are inserted, in accordance with the arrangement of the solder balls 41 of the IC 4. The insert 2, mounted on the transport frame 10, is transported in a state where the IC 4 is received therein and the solder balls 41 are received in the positioning bores 29.

Figure 8B:
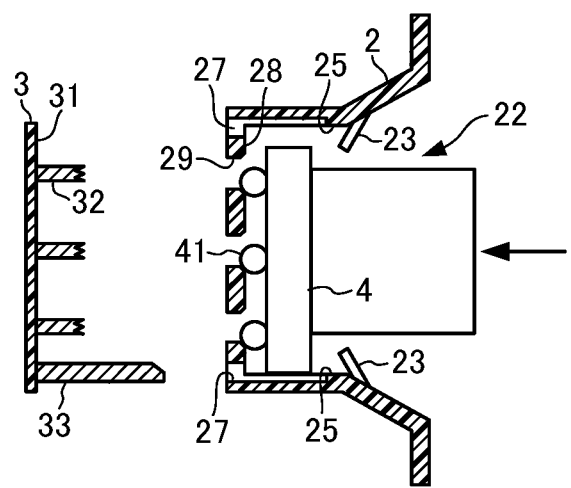

As shown in FIG. 8B, when the IC 4 is under test, the transport frame 10 is held vertically, and the inserts 2 mounted on the transport frame 10 are held vertically as well. At the same time, the solder balls 41 falls out of the positioning bores 29 and the IC 4 is displaced downward as the IC 4 drops down on the side wall 25 of the concave portion 22.

Figure 8C:
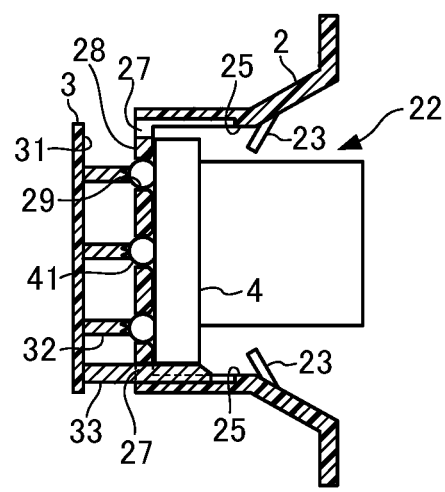

Eventually, however, as shown in FIG. 8, when the IC 4 is pushed toward the test socket 3 by the pusher of the handler, the position adjustment guide 33 of the test socket 3 goes into and penetrates through the guide through bore 27 formed in the insert 2, so that the IC 4 is lifted up by the tapered shape of the position adjustment guide 33. Thus, the solder balls 41 are again brought into the positioning bores 29 of the insert 2, so that the downward displacement of the IC 4 is solved, thereby making it possible to have the contact pins 32 of the test socket 3 and the solder balls 41 of the IC 4 securely held in contact with each other.

Fifth Embodiment

Hereinafter, the fifth embodiment of the present invention will be explained with reference to FIG. 9. The present embodiment is an embodiment of a case in which the solder ball 41 is provided in a central portion of the IC 4 as well. The explanation of a part of the present embodiment that is the same as that of the first embodiment is omitted.

Figure 9:
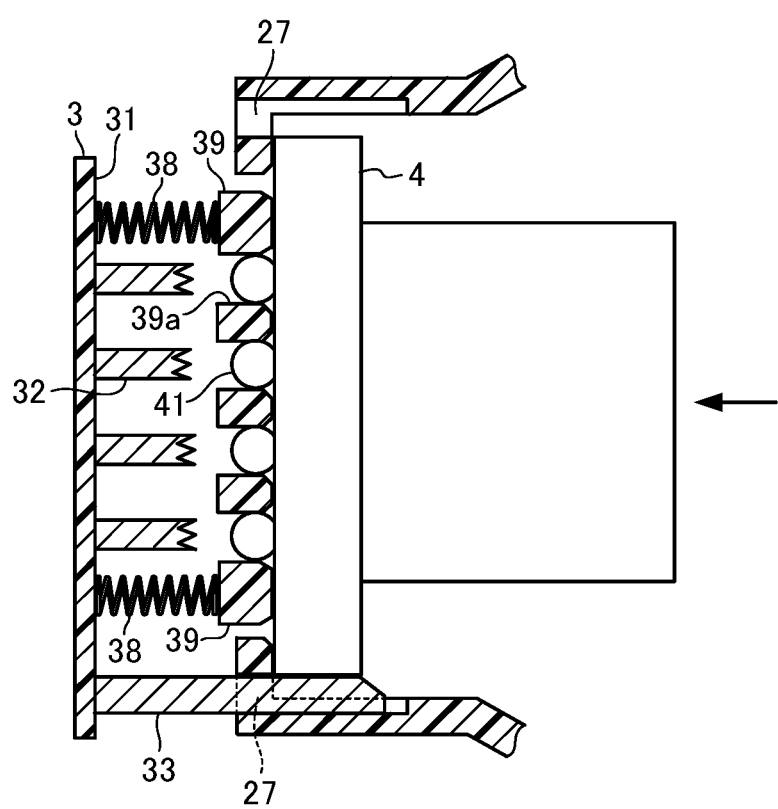
FIG. 9 is a schematic diagram showing a semiconductor test apparatus according to the fifth embodiment of the present invention.

As shown in FIG. 9, a positioning base 39 covers over a portion where a plurality of contact pins 32 are provided on the socket surface 31. The positioning base 39 has a plurality of positioning bores 39a, where the solder balls 41 of the IC 4 are inserted when the IC 4 comes under test, arranged thereon in accordance with the arrangement of the contact pins 32 on the socket surface 31. The arrangement of the positioning bores 39a is in accordance with the arrangement of a plurality of solder balls 41 in the IC 4 as well.

As shown in FIG. 9, during the test of the IC 4, the IC 4 is pushed toward the test socket 3. Here, since the tip of the positioning base 39 is urged by the coil spring 38 to be at a position more spaced apart from the socket surface 31 than a tip of the contact pins 32, the IC 4 comes into contact with the positioning base 39 prior to the solder ball 41 comes in contact with the contact pin 32. At this moment, the IC 4 is already lifted up along the tapered shape, thanks to the position adjustment guide 33 being formed in the tapered shape.

As the result, the downward displacement of the IC 4, caused by laying the insert 2 sideways for testing the IC 4, is solved, so that the solder balls 41 are correctly guided into the positioning bores 39a of the positioning base 39, thereby having the IC 4 seated on the positioning base 39 in a favorably positioned state.

Thus, the IC 4 has its position fixed, allowing the IC 4, together with the insert 2, to be straightly pushed by the pusher in that state, thereby making it possible to have the solder balls 41 correctly held in a face-to-face relationship with a plurality of the contact pins 32, when the IC 4 is brought closer to the contact pin 32.

The foregoing explanations of the semiconductor test apparatus according to the present invention are especially directed to the cases where vertical type handlers are used. However, this does not prevent the semiconductor test apparatus according to the present invention from being applicable to the cases where horizontal type handlers are used.

INDUSTRIAL APPLICABILITY

The semiconductor test apparatus according to the present invention can be applicable to the testing of semiconductors using vertical type handlers. Therefore, the semiconductor test apparatus according to the present invention is applicable to industries.

DESCRIPTION OF REFERENCE NUMERALS 1 semiconductor test apparatus
2 insert
3 test socket
4 IC
10 transport frame
21 main body
22 concave portion 23 latch
24 operation plate
25 side wall
26 edge
27 through bore
31 socket surface
32 contact pin
33 position adjustment guide
34 lateral position adjustment guide
35 hinge mechanism
36 small protrusion
37 positioning base
38 coil spring
41 solder ball

The invention claimed is:

1. A semiconductor test apparatus, comprising:
a test socket having a socket surface formed thereon, the socket surface having a contact pin towering therefrom; and
a semiconductor transport fixture having a concave portion formed thereon, the concave portion adapted to receive therein an IC under test, wherein
the test socket has a position adjustment guide provided thereon,
the semiconductor transport fixture has a guide through bore formed therein, the guide through bore adapted to receive the position adjustment guide therethrough when the IC under test comes under test, and
either one of the position adjustment guide or the guide through bore is formed in a tapered shape such that, when the guide through bore receives therethrough the position adjustment guide at the time of test of the IC under test, the position adjustment guide pushes upward the IC under test to adjust the position of the IC under test.

2. The semiconductor test apparatus as set forth in claim 1, wherein
the position adjustment guide is fixed to perpendicularly tower from the socket surface, and
the position adjustment guide is formed in a tapered shape approaching the contact pin as advancing in a longitudinal direction from a tip toward a base thereof.

3. The semiconductor test apparatus as set forth in claim 1, wherein
the position adjustment guide is rotatably supported by a hinge mechanism arranged on the test socket,
the position adjustment guide is so urged to perpendicularly tower from the socket surface, and
the guide through bore is formed in a tapered shape approaching the concave portion as advancing toward inside thereof.

4. The semiconductor test apparatus as set forth in claim 3, wherein
the position adjustment guide has a small protrusion provided on an upper side thereof.

5. The semiconductor test apparatus as set forth in claim 1, wherein
the test socket has a lateral position adjustment guide further provided respectively in a right end portion and a left end portion on the socket surface, each of the lateral position adjustment guides towering perpendicularly from the socket surface,
the guide through bore is adapted to receive the lateral position adjustment guide therethrough when the IC under test comes under test, and
either one of the lateral position adjustment guide or the guide through bore is formed in a tapered shape.

6. The semiconductor test apparatus as set forth in claim 1, wherein
the test socket includes a plurality of the contact pins and a positioning base, the positioning base being located among the neighboring plurality of contact pins, the positioning base being urged to be at a position more spaced apart from the socket surface than a tip of the contact pin.

* * * * *